United States Patent
Rakova et al.

(10) Patent No.: US 10,141,929 B2
(45) Date of Patent: Nov. 27, 2018

(54) PROCESSING ELECTROMAGNETIC INTERFERENCE SIGNAL USING MACHINE LEARNING

(71) Applicant: Samsung Electronics Company, Ltd., Suwon, Gyeong gi-Do (KR)

(72) Inventors: Bogdana Rakova, Menlo Park, CA (US); Mike Digman, Mountain View, CA (US); Philipp Schoessler, Mountain View, CA (US); Martin Salvador, San Jose, CA (US); Sergi Consul Pacareu, Memphis, TN (US); Olivier Bau, San Francisco, CA (US)

(73) Assignee: Samsung Electronics Company, Ltd., Suwon (KR)

( * ) Notice: Subject to any disclaimer, the term of this patent is extended or adjusted under 35 U.S.C. 154(b) by 264 days.

(21) Appl. No.: 15/153,573

(22) Filed: May 12, 2016

(65) Prior Publication Data

US 2016/0261268 A1 Sep. 8, 2016

Related U.S. Application Data

(63) Continuation-in-part of application No. 14/458,110, filed on Aug. 12, 2014, now Pat. No. 9,569,055.
(Continued)

(51) Int. Cl.
*H03K 17/96* (2006.01)
*G06N 99/00* (2010.01)
(Continued)

(52) U.S. Cl.
CPC ........... *H03K 17/962* (2013.01); *G06F 1/163* (2013.01); *G06F 3/046* (2013.01); *G06F 3/0416* (2013.01);
(Continued)

(58) Field of Classification Search
CPC ........ G06F 3/044; G06F 3/0416; G06F 3/046; G06F 3/041; G06F 2203/04106;
(Continued)

(56) References Cited

U.S. PATENT DOCUMENTS 4,281,323 A 7/1981 Burnett
5,796,389 A 8/1998 Bertram
(Continued)

FOREIGN PATENT DOCUMENTS

CN 101310246 11/2008
CN 102566840 7/2012
(Continued)

OTHER PUBLICATIONS

Response to Final Office Action for U.S. Appl. No. 15/153,362, dated Nov. 30, 2017.
(Continued)

*Primary Examiner* — Koosha Sharifi-Tafreshi
(74) *Attorney, Agent, or Firm* — Baker Botts L.L.P.

(57) ABSTRACT

In one embodiment, a method includes receiving, by an electrode of a device, a signal from a user's body. The received signal is based on an electromagnetic interference signal generated by an object that is external to the device. The method further includes determining, using machine learning applied to the received signal, one or more of the following: an identity of the object, an interaction between the user and the object, or a context surrounding the device.

20 Claims, 9 Drawing Sheets

Related U.S. Application Data

(60) Provisional application No. 61/865,448, filed on Aug. 13, 2013, provisional application No. 61/924,558, filed on Jan. 7, 2014, provisional application No. 61/924,604, filed on Jan. 7, 2014, provisional application No. 61/924,625, filed on Jan. 7, 2014, provisional application No. 61/924,637, filed on Jan. 7, 2014, provisional application No. 61/969,544, filed on Mar. 24, 2014, provisional application No. 61/969,558, filed on Mar. 24, 2014, provisional application No. 61/969,590, filed on Mar. 24, 2014, provisional application No. 61/969,612, filed on Mar. 24, 2014, provisional application No. 62/000,429, filed on May 19, 2014, provisional application No. 62/219,635, filed on Sep. 16, 2015, provisional application No. 62/260,244, filed on Nov. 25, 2015, provisional application No. 62/260,247, filed on Nov. 25, 2015.

(51) Int. Cl.
  *G06N 7/00*    (2006.01)
  *G06F 1/16*    (2006.01)
  *G06F 3/041*   (2006.01)
  *G06F 3/046*   (2006.01)

(52) U.S. Cl.
  CPC .......... *G06F 3/0418* (2013.01); *G06N 7/005* (2013.01); *G06N 99/005* (2013.01); *G06F 2203/04104* (2013.01)

(58) Field of Classification Search
  CPC .......... G06F 2203/04104; G06F 3/017; G06F 1/163; G01R 31/001
  See application file for complete search history.

(56) References Cited

U.S. PATENT DOCUMENTS

| | | | |
|---|---|---|---|
| 5,956,020 A | 9/1999 | D'Amico | |
| 6,007,532 A | 12/1999 | Netherly | |
| 6,180,894 B1 | 1/2001 | Chao | |
| 6,476,798 B1 | 11/2002 | Bertram | |
| 7,551,916 B2 | 6/2009 | Görtz | |
| 8,032,330 B2 | 10/2011 | Mäkelä | |
| 8,294,687 B1 | 10/2012 | Ksondzyk | |
| 8,326,255 B2 | 12/2012 | Ullen | |
| 8,432,368 B2 | 4/2013 | Momeyer | |
| 8,723,836 B1 | 5/2014 | Shapiro | |
| 8,843,642 B2 | 9/2014 | Shen | |
| 8,849,358 B2 | 9/2014 | Lockwood | |
| 8,928,587 B1 | 1/2015 | Smus | |
| 9,043,247 B1 | 5/2015 | Hart | |
| 9,109,952 B2 | 8/2015 | Dinh | |
| 9,113,794 B2 | 8/2015 | Hong | |
| 9,152,178 B2 | 10/2015 | Koch | |
| 9,164,609 B2 | 10/2015 | Ricks | |
| 2003/0098858 A1 | 5/2003 | Perski | |
| 2004/0183788 A1 | 9/2004 | Kurashima | |
| 2007/0015559 A1 | 1/2007 | Zalewski | |
| 2008/0018618 A1 | 1/2008 | Hill | |
| 2008/0284743 A1 | 11/2008 | Hsu | |
| 2009/0174576 A1 | 7/2009 | Allen | |
| 2009/0228240 A1 | 9/2009 | Makela | |
| 2009/0309851 A1 | 12/2009 | Bernstein | |
| 2009/0327171 A1 | 12/2009 | Tan | |
| 2010/0214232 A1 | 8/2010 | Chan | |
| 2010/0253319 A1 | 10/2010 | Cehelnik | |
| 2010/0285849 A1 | 11/2010 | Porjo | |
| 2011/0074701 A1 | 3/2011 | Dickenson | |
| 2011/0152972 A1 | 6/2011 | Doerr | |
| 2011/0245940 A1 | 10/2011 | Picco | |
| 2011/0260741 A1 | 10/2011 | Weaver | |
| 2012/0092244 A1 | 4/2012 | Lota | |
| 2012/0105081 A1 | 5/2012 | Shaikh | |
| 2012/0105273 A1 | 5/2012 | Nettelblad | |
| 2012/0117007 A1 | 5/2012 | Agrawal | |
| 2012/0162057 A1* | 6/2012 | Tan | G06F 3/011 345/156 |
| 2012/0188183 A1 | 7/2012 | Heo | |
| 2012/0242608 A1 | 9/2012 | Koshiyama | |
| 2012/0274583 A1 | 11/2012 | Haggerty | |
| 2013/0049531 A1 | 2/2013 | Wang | |
| 2013/0090065 A1 | 4/2013 | Fisunenko | |
| 2013/0093725 A1 | 4/2013 | Reynolds | |
| 2013/0106769 A1 | 5/2013 | Bakken | |
| 2013/0106777 A1 | 5/2013 | Yilmaz | |
| 2013/0154992 A1 | 6/2013 | Nascimento | |
| 2013/0181937 A1 | 7/2013 | Chen | |
| 2013/0222230 A1 | 8/2013 | Choi | |
| 2013/0222270 A1 | 8/2013 | Winkler | |
| 2013/0222930 A1 | 8/2013 | Jung | |
| 2013/0257793 A1 | 10/2013 | Zeliff | |
| 2014/0179236 A1 | 6/2014 | Prakash | |
| 2014/0256247 A1 | 9/2014 | Wietfeldt | |
| 2014/0273849 A1 | 9/2014 | Lee | |
| 2014/0343380 A1 | 11/2014 | Carter | |
| 2014/0375352 A1* | 12/2014 | Patel | G01R 31/001 324/764.01 |
| 2015/0022224 A1 | 1/2015 | Ruusunen | |
| 2015/0022480 A1 | 1/2015 | Case | |
| 2015/0033194 A1 | 1/2015 | Schillings | |
| 2015/0049034 A1 | 2/2015 | Post | |
| 2015/0049056 A1 | 2/2015 | Post | |
| 2015/0091594 A1 | 4/2015 | Hamilton | |
| 2015/0126845 A1 | 5/2015 | Jin | |
| 2015/0157222 A1 | 6/2015 | LeBoeuf | |
| 2015/0181087 A1 | 6/2015 | Mistry | |
| 2015/0193102 A1 | 7/2015 | Lanier | |
| 2015/0199578 A1 | 7/2015 | Vasquez | |
| 2015/0233998 A1* | 8/2015 | Chen | G01R 31/086 324/764.01 |
| 2015/0242015 A1 | 8/2015 | Choi | |
| 2015/0261373 A1 | 9/2015 | Smus | |
| 2015/0278498 A1 | 10/2015 | Hong | |
| 2015/0286813 A1 | 10/2015 | Jakobsson | |
| 2015/0293598 A1 | 10/2015 | Wang | |
| 2015/0359491 A1 | 12/2015 | Luna | |
| 2016/0274758 A1 | 9/2016 | Bailey | |
| 2017/0124816 A1* | 5/2017 | Yang | G06Q 10/0833 |

FOREIGN PATENT DOCUMENTS

| | | |
|---|---|---|
| CN | 102859478 | 1/2013 |
| CN | 103092502 | 5/2013 |
| CN | 103164073 | 6/2013 |
| CN | 103164096 | 6/2013 |
| CN | 103226406 | 7/2013 |
| JP | 49-1136 | 1/1974 |
| JP | S61204723 | 9/1986 |
| JP | H05340709 | 12/1993 |
| JP | H06149447 | 5/1994 |
| JP | H0876924 | 3/1996 |
| JP | 2000076005 | 3/2000 |
| JP | 2005018726 | 1/2005 |
| JP | 2006512626 | 4/2006 |
| JP | 2007525761 | 9/2007 |
| JP | 2008190902 | 8/2008 |
| JP | 2009054141 | 3/2009 |
| JP | 2009276978 | 11/2009 |
| JP | 2011185680 | 9/2011 |
| JP | 2011-028603 | 2/2012 |
| JP | 2012133771 | 7/2012 |
| JP | 2012168747 | 9/2012 |
| JP | 2012530306 | 11/2012 |
| JP | 2013020530 | 1/2013 |
| JP | 2013054738 | 3/2013 |
| JP | 2003173238 | 6/2013 |
| JP | 2013531305 | 8/2013 |
| JP | 2009516295 | 4/2016 |
| KR | 20110100051 | 9/2011 |
| WO | WO 2007/058727 | 5/2007 |

(56) References Cited

FOREIGN PATENT DOCUMENTS

| WO | WO 2008/061539 | 5/2008 |
|---|---|---|
| WO | WO 2012/087851 A2 | 6/2012 |
| WO | WO 2012-112561 | 8/2012 |
| WO | WO 2014/088768 | 6/2014 |
| WO | WO 2014/137523 | 9/2014 |
| WO | WO 2014/164912 | 10/2014 |
| WO | WO 2015/158189 | 10/2015 |

OTHER PUBLICATIONS

Non-Final Office Action for U.S. Appl. No. 15/153,362, dated Dec. 19, 2017.
Response to Final Office Action for U.S. Appl. No. 15/153,599, dated Jan. 10, 2018.
Non-Final Office Action for U.S. Appl. No. 15/153,599, dated Jun. 8, 2017.
ISR and WO for International Application No. PCT/KR2016/010358, dated Dec. 19, 2016.
ISR and WO for International Application No. PCT/KR2016/010370, dated Dec. 20, 2016.
ISR and WO for International Application No. PCT/KR2016/010361, dated Jan. 2, 2017.
ISR and WO for International Application No. PCT/KR2016/013408, dated Feb. 20, 2017.
CN OA for CN Patent Application No. 2014-80003733.9 with English translation, dated Jan. 4, 2017.
CN OA for CN Patent Application No. 2014-80004271.2 with English translation, dated Dec. 22, 2016.
CN OA for CN Patent Application No. 2014-80007036.0 no English translation, dated Feb. 16, 2017.
KR OA for KR Patent Application No. 10-2015-7009399 with English translation, dated Feb. 28, 2017.
Yang, Ya et al. "Single-Electrode-Based Sliding Triboelectric Nanogenerator for Self-Powered Displacement Vector Sensor System," American Chemical Society, vol. 7, No. 8, Jul. 24, 2016.
Response to Non-Final Office Action for U.S. Appl. No. 15/153,362, dated Aug. 16, 2017.
Final Office Action for U.S. Appl. No. 15/153,362, dated Aug. 31, 2017.
Response to Non-Final Office Action for U.S. Appl. No. 15/153,599, dated Sep. 8, 2017.
Final Office Action for U.S. Appl. No. 15/153,599, dated Oct. 10, 2017.
Office Action for CN Application No. 201480004271.2 (with English translation), dated Aug. 8, 2017.
U.S. Appl. No. 15/153,362, filed May 12, 2016, Olivier Bau.
U.S. Appl. No. 15/153,599, filed May 12, 2016, Olivier Bau.
Australian Notice of Acceptance for Application No. 2014307235, dated Aug. 22, 2016.
Australian Notice of Acceptance for Application No. 2014307236, dated Oct. 5, 2016.
Korean Notice of Allowance for Application No. 10-2015-7009398, dated Sep. 22, 2016.
Korean Notice of Allowance for Application No. 10-2015-7009399, dated Sep. 27, 2016.
Gabe Cohn et al., "Your Noise is My Command: Sensing Gestures Using the Body as an Antenna", CHI, May 7, 2011-May 12, 2011.
Gabe Cohn et al., "Humantenna: Using the Body as an Antenna for Real-Time Whole-Body Interaction", CHI, May 5, 2012-May 10, 2012.
Mi Zhang et al., "A Preliminary Study of Sensing Appliance Usage for Human Activity Recognition Using Mobile Magnetometer", UbiComp, Sep. 5, 2012-Sep. 8, 2012.
Ke-Yu Chen, "u-Touch: Sensing Touch Gestures on Unmodified LCDs", CHI, Apr. 27, 2013-May 2, 2013.
Edward J. Wang et al., "MagnifiSense: Inferring Device Interaction using Wrist-Worn Passive Magneto-Inductive Sensors", UbiComp/ISWC Adjunct, Sep. 7, 2015-Sep. 11, 2015.
Gierad Laput et al., "EM-Sense: Touch Recognition of Uninstrumented, Electrical and Electromechanical Objects", UIST, Nov. 8, 2015-Nov. 11, 2015.
Non-Final Office Action for U.S. Appl. No. 15/153,362, dated May 16, 2017.
Ghosh, S., et al., "Measurement of radiated emission using different EMI sensors in the laboratory environment", International Conference on Electromagnetic Interference & Compatibility, INCEMIC, at Bangalore, India, Oct. 2015.
Response to Non-Final Office Action for U.S. Appl. No. 15/153,573, dated Mar. 19, 2018.
Response to Non-Final Office Action for U.S. Appl. No. 15/153,599, dated Apr. 25, 2018.
Notice of Allowance for U.S. Appl. No. 15/153,362, dated May 3, 2018.
Notice of Allowance for U.S. Appl. No. 15/153,599, dated Jun. 11, 2018.
Kurita et al., "A new technique for touch sensing based on measurement of current generated by electrostatic induction", Sensor and Actuators A 170, Jun. 5, 2011.
JP Office Action for Application No. 2016-534533 (no English translation), dated Apr. 3, 2018.
JP Office Action for Application No. 2016-534531 (no English translation), dated Apr. 3, 2018.
JP Office Action for Application No. 2016-534532 (no English translation), dated Apr. 3, 2018.
EP Notice of Allowance for Application No. 14836371.6-1231, dated Jun. 1, 2018.
EP Extended European Search Report for Application No. 16846887.4-1221, dated Jun. 5, 2018.
EP Extended European Search Report for Application No. 16868842.2-1221, dated Jun. 5, 2018.
EP Final Office Action for Application No. 14836851.7-1231, dated Jun. 8, 2018.
CN Office Action for Application No. 201480007098.1 (with English translation), dated Jan. 3, 2018.
CN Office Action for Application No. 201480007036.0 (with English translation), dated Jan. 4, 2018.

* cited by examiner

PROCESSING ELECTROMAGNETIC INTERFERENCE SIGNAL USING MACHINE LEARNING

RELATED APPLICATIONS

This application claims the benefit, under 35 U.S.C. § 120, of U.S. patent application Ser. No. 14/458,110, filed on 12 Aug. 2014, which claims the benefit under 35 U.S.C. § 119(e), of each of the following: U.S. Provisional Patent Application No. 61/865,448, filed 13 Aug. 2013; U.S. Provisional Patent Application No. 61/924,558, filed 7 Jan. 2014; U.S. Provisional Patent Application No. 61/924,604, filed 7 Jan. 2014; U.S. Provisional Patent Application No. 61/924,625, filed 7 Jan. 2014; U.S. Provisional Patent Application No. 61/924,637, filed 7 Jan. 2014; U.S. Provisional Patent Application No. 61/969,544, filed 24 Mar. 2014; U.S. Provisional Patent Application No. 61/969,558, filed 24 Mar. 2014; U.S. Provisional Patent Application No. 61/969,590, filed 24 Mar. 2014; U.S. Provisional Patent Application No. 61/969,612, filed 24 Mar. 2014; and U.S. Provisional Patent Application No. 62/000,429, filed 19 May 2014. This application also claims the benefit, under 35 U.S.C. § 119(e), of each of the following: U.S. Provisional Patent Application No. 62/219,635, filed 16 Sep. 2015; U.S. Provisional Patent Application No. 62/260,244, filed 25 Nov. 2015; and U.S. Provisional Patent Application No. 62/260,247, filed 25 Nov. 2015. Each of these applications is incorporated herein by reference.

TECHNICAL FIELD

This disclosure generally relates to electronic devices that detect electromagnetic interference.

BACKGROUND

A first device may identify a second device using a communications channel set up between the two devices. For example, the second device may encode identification information in a signal, such as a Bluetooth signal or Wi-Fi signal, and transmit the encoded signal to the first device. The first device may detect the signal and decode it in order to access the encoded identification information of the second device. However, device identification may not occur if one or both devices are not capable of decoding, encoding, transmitting, and/or receiving the signal. In addition, noise or other interference in the communication channel may prevent device identification.

DESCRIPTION OF EXAMPLE EMBODIMENTS

Electronic devices, cables, wires, and other conductors emit electromagnetic radiation when operating or exposed to electromagnetic and electronic signals. For example, power lines, appliances, and mobile and computing devices may emit electromagnetic radiation, which may also be referred to as environmental electromagnetic interference (EMI) or electronic noise. A conductive object may couple to the EMI in its environment. For example, coupling may occur by direct coupling (i.e., contact forming a conductive pathway) with an object generating EMI or by capacitive coupling to the object generating EMI. As an example, the human body is a slight conductor and thus may couple to, and act as an antenna for, EMI signals. An object coupled to EMI signals may couple to second conductive object and transmit EMI signals to the second conductive object. For example, a portion of a user's body may capacitively couple to an electrode of a device and transmit to the electrode EMI signals coupled to the body.

Figure 1:
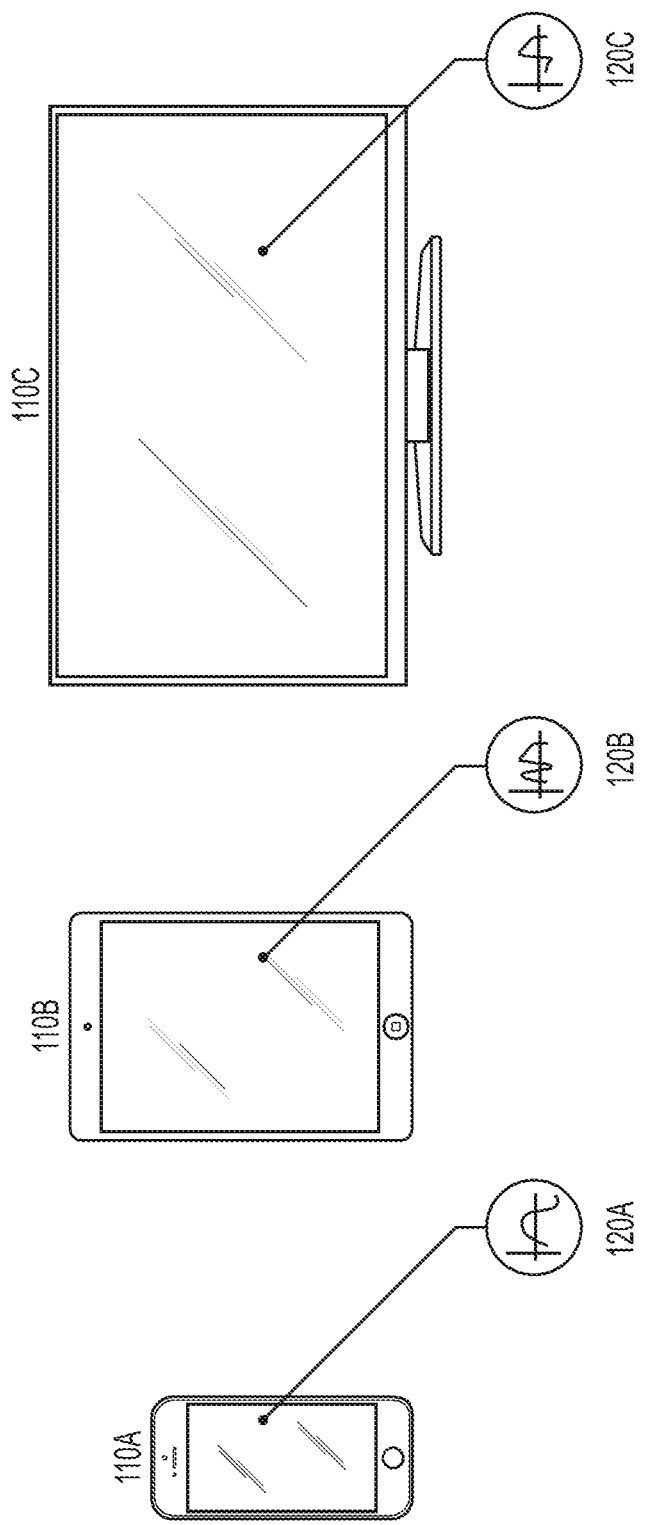
FIG. 1 illustrates example electromagnetic interference signals generated by example electronic devices.

The signals received from a conductive object coupled to EMI signals may be characteristic of the EMI signals generated and characteristic of the object. For example, the frequencies, bandwidth, amplitudes, and phase of EMI signals may be characteristic of the electronic components generating the EMI and the conductive properties of the object coupled to the EMI. FIG. 1 illustrates example devices 110A, 110B, and 110C generating example EMI signals 120A, 120B, and 120C, respectively. While FIG. 1 illustrates the amplitude (vertical axis) of EMI signals generated by devices 110A, 110B, and 110C as a function of frequency of the EMI signal (horizontal axis), this disclosure contemplates that generated EMI signals may be represented in any suitable form, including but not limited to the amplitude of an EMI signal (or particular component of an EMI signal) as a function of time.

As illustrated in FIG. 1, EMI signals generated by a device may depend on the make, type, or model of the device. Particular characteristics of EMI signals may depend on the precise configuration and operation of electronic components within a device such that devices—and/or components within the devices—are uniquely identifiable. Moreover, EMI signals may vary based on the state or mode of operation of the device. For example, EMI signals may identify that: a battery is charging; Bluetooth or Wi-Fi components are operating; a display is operating; or that particular content is displayed on a display. EMI signals may vary based on the specific type of electronic components used in a circuit, tolerance values, the specific configuration of those components, and the electrical signals and fields those circuits are exposed to. Thus, individual components, circuits, and devices may be identified based on the EMI signals individually and collectively generated by components and collection of components. The signals can then be processed to identify the components or devices generating the signals, identify the operating mode or state of components or devices, and/or identify an object coupled to the signals and transmitting the signals. Processing may also associate specific signals with an environment or context of the device detecting the EMI signals. U.S. patent application Ser. No. 14/458,110, filed on 12 Aug. 2014 and incorporated herein by reference, discloses examples methods and systems for detecting and processing EMI signals, along with associated functionality.

Figure 2:
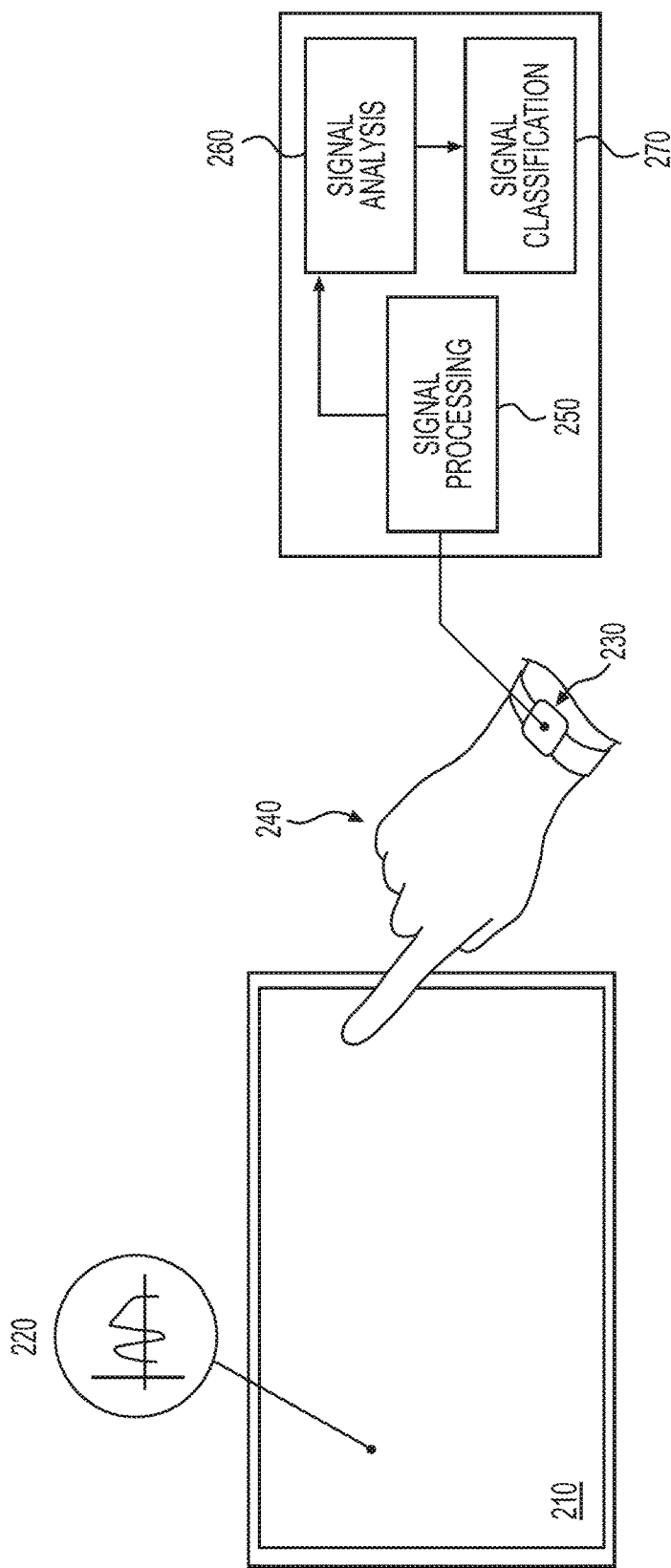
FIG. 2 illustrates an example detection of electromagnetic interference signals by an example detecting device.

In particular embodiments, a device worn or held by a user may receive signals from the user's body that are based on EMI coupled to the user's body. The signals received by the device may be processed to determine interactions between the user and the device emitting the EMI, identify the device emitting EMI, determine a context of the user, or any suitable combination thereof. FIG. 2 illustrates an example device 230 having example hardware for detecting and processing EMI signals. As described above and illustrated in FIG. 2, EMI signals 220 generated from an object such as device 210 are coupled to a body of a user 240, either directly or capacitively. Device 230 is coupled, either directly or capacitively, to user 240 and receives EMI signals transmitted through the user's body. As described more fully herein, device 230 receives and processes the EMI signals transmitted by user 240 to determine information about device 210, interactions between the user 240 and the device 210, and/or the context surrounding the device 230. While FIG. 2 illustrates an example device 230 this disclosure contemplate that EMI signals may be received and processed by any suitable device or number of devices. For example, device 230 may be: a wearable device such as a watch, ring, necklace, or pendant; embedded in mobile devices such as smart phones and tablets; embedded in keyboards, mice, laptops; embedded in appliances, furniture, public displays, cars (such as seats or steering wheels), clothing, health trackers, headbands, wristbands, or accessories such as backpacks. This disclosure contemplates any suitable device having any suitable functionality, such as for example, the wearable devices and associated functionality described in U.S. Pat. No. 9,030,446 issued 12 May 2015 and incorporated herein by reference.

Device 230 may receive signals from user 240 by one or more electrodes of the device 230 coupled to the user. In particular embodiments, coupling may be direct, such that all or part of the electrode is in contact with the user's skin. In particular embodiments, coupling may be indirect, such that the electrode is capacitively coupled to the user. For example, the electrode may be separated from the user by a covering for device 230 or by the user's clothing. This disclosure contemplates any suitable number and configuration of electrodes for receiving EMI signals from user 240. For example, the electrode technology and configurations disclosed in U.S. patent application Ser. No. 14/458,110, filed on 12 Aug. 2014 and incorporated herein by reference, for receiving EMI signals may be used, when suitable. In particular embodiments, electrodes may be flexible enough to conform to the contours of user 240, such as for example, a wrist or head of user 240. In particular embodiments, one or more electrodes of device 230 may receive EMI signals from the environment, i.e., other than from user 240, for example the EMI signals described in U.S. patent application Ser. No. 14/458,110.

Device 230 may include one or more components—including hardware, software, or both—for processing a received EMI signal. For example, device 230 may include components 250 for amplifying an EMI signal, components 260 for analyzing a signal, and components 270 for classifying a signal.

Figure 3:
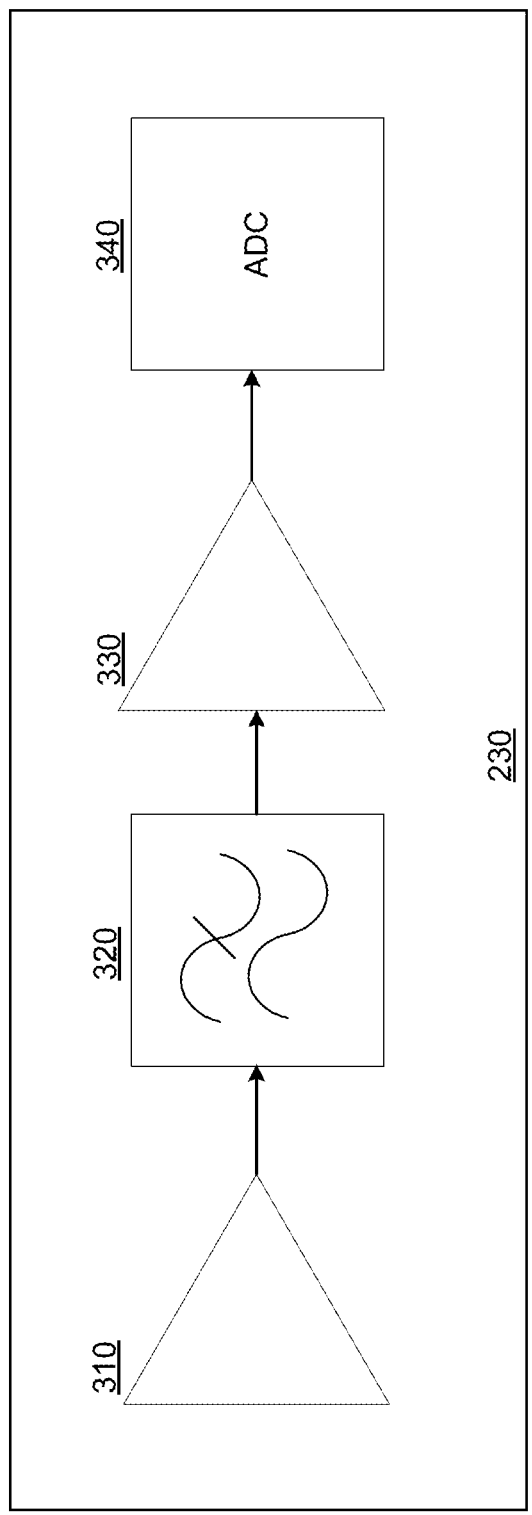
FIG. 3 illustrates example hardware of an example device for detecting electromagnetic interference signals.

FIG. 3 illustrates example components of device 230 for amplifying and processing an EMI signal. As illustrated in FIG. 3, device 230 may include a pre-amplifier, such as low noise trans-impedance amplifier 310. In particular embodiments, a pre-amplifier may apply variable gain to the received signal. Device 230 may also include one or more filters, such as low pass filter 320, to filter the output from a pre-amplifier. Device 230 may include an amplifier, such as variable gain amplifier 330. In particular embodiments, the amplifier may scale the signal, for example to ensure that the signal stays within a particular amplitude range. In particular embodiments, the amplitude range may depend on the desired application or functionality. In particular embodiments, a gain associated with the amplifier may be dynamically variable. In particular embodiments, variable gain of the pre-amplifier, variable gain of the amplifier, and cutoff frequencies of the filter(s) can be controlled in hardware, software, or both, depending on the application and responsiveness required. In particular embodiments, device 230 may include an analog to digital converter (ADC) 340. In particular embodiments, ADC 340 may have a programmable sampling frequency controllable by hardware, software, or both. In particular embodiments, a device may be tuned to use regulatory-allowed EMI emissions of a device generating EMI and reject other sources of noise. In particular embodiments, doing so may avoid dynamically characterizing EMI signals.

Figure 4:
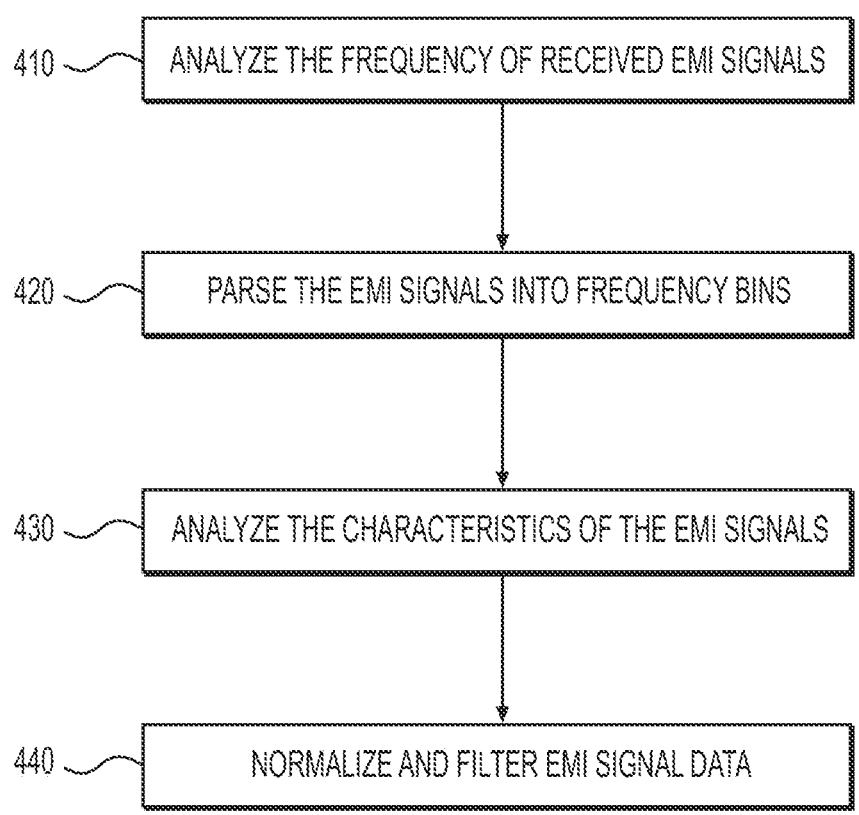
FIG. 4 illustrates an example method for processing and analyzing detected electromagnetic interference signals.

In particular embodiments, device 230 may include hardware or software for analyzing EMI signals, such as signals received by an analog front end and an ADC. FIG. 4 illustrates an example method 400 for analyzing EMI signals. At step 410, a frequency analysis of all or some of EMI signals is performed, for example using a fast Fourier transform (FFT) on the received signals. Step 410 may calculate the frequency domain representation of the received EMI signals or a portion the EMI signal. Certain frequencies may be identified as noise, either during this point or any other suitable point (such as a filtering stage) in the signal processing. In particular embodiments, a particular frequency range may be analyzed. For example, signals in 1 to 600 kHz, 600 to 1200 kHz, or 1 to 1200 kHz may be analyzed. In particular embodiments, signals outside of the frequency may be ignored or filtered, for example by using filter 320 of FIG. 3.

At step 420, a frequency spectrum may be parsed for further analysis, such as for example into a particular number (e.g., 1000) bins or into bins of a particular bandwidth. In particular embodiments, only a portion of the frequency signals may be parsed.

At step 430, characteristics of the EMI signal may be analyzed. For example, the amplitude of the signal within each frequency bin or range may be determined, for example, by analyzing the power spectrum density (PSD) of the signal. As another example, the phase of the signal may be determined. In particular embodiments, statistical methods may be used, for example, to calculate a standard deviation, root-mean-squared value, mean, etc. of the EMI signal or of particular aspects of the EMI signal. While this disclosure discusses example signal analysis that occurs in the frequency domain, this disclosure contemplates any suitable analysis, including analysis in the spatial or temporal domain. Moreover, this disclosure contemplates that any other suitable data, such as data from other sensors, may be analyzed and characterized as appropriate to perform the functionality described herein.

At step 440, the analyzed data may be normalized and filtered, at which point method 400 may end. Particular embodiments may repeat one or more steps of the method of FIG. 4, where appropriate. Although this disclosure describes and illustrates particular steps of the method of FIG. 4 as occurring in a particular order, this disclosure contemplates any suitable steps of the method of FIG. 4 occurring in any suitable order. Moreover, this disclosure contemplates any suitable method for analyzing EMI signals including any suitable steps, which may include all, some, or none of the steps of the method of FIG. 4. Furthermore, although this disclosure describes and illustrates particular components, devices, or systems carrying out particular steps of the method of FIG. 4, this disclosure contemplates any suitable combination of any suitable components, devices, or systems carrying out any suitable steps of the method of FIG. 4.

In particular embodiments, step 430 may include Principal Component Analysis (PCA) to select a lower-dimensional subspace in which to project a raw feature vector. In particular embodiments, the output of the PCA process emphasizes—and may maximize—the difference in variance between each component or dimension in the lower-dimensional subspace. The output of PCA may be transformation matrix that is used, for example, as part of step 440.

In particular embodiments, signal analysis may include subspace linear discriminant analysis (LDA), quadratic discriminant analysis (QDA), or both. For example, signal data consisting of N frequency bins of the PSD may be used. In addition, changes of the EMI signal within some or all of those N frequency bins may be analyzed as a function of time. Step 430 may analyze the entropy and variance of each frequency bin across known interaction events and environments in order to choose a subspace to project the data. In particular embodiments, a size of the subspace may be chosen. In particular embodiments, a size of the subspace may vary, for example based on the intended functionality. In particular embodiments, principal component analysis may be performed and data projected into the subspace. In particular embodiments, LDA or QDA may then be applied. In particular embodiments, any combination of PCA, LDA, and QDA may be applied.

In particular embodiments, signal analysis may apply regression methods to EMI signals, for example to determine the location of a touch event on device 210. For example, an LDA or QDA may be applied. Next, the distance in a higher dimensional space between a single sample (pre-processed PSD) and all linear discriminants may be calculated. Finally, a regression model may be trained to fit these distances to the specific location of the touch event in the two dimensional space of the display using, e.g., Cartesian coordinates.

In particular embodiments, signal analysis may include step localized binary search methods, for example to localize a touch event on device 210. For example, an N-bins dimensional PSD-space of the signal in order may be analyzed to build a tree of classifiers to predict the location of the point of interaction with the device. In particular embodiments, the overall model may be restricted to binary trees. For each sample, the most outer classifier is chosen and used to split the area into two parts depending of the variances and other statistical metrics of the features (e.g., the FFT bins). The search method then estimates which of the two areas the sample belongs to by scoring the areas with a probability score and selecting the area with the highest probability score. The search method may then navigate down the tree of classifiers, each time splitting one area into two sub-areas. Finally, a specific area of the device is estimated as the location at which the touch event took place.

In particular embodiments, device 230 (or any other suitable processing device) may process signals received from user 240 at pre-determined intervals, such as every second. In particular embodiments, the processing device may sample more frequently after one or more EMI signals of interest are detected. In particular embodiments, the processing device may apply processing to all received signals (e.g., all signals in the entire bandwidth), and then focus processing resources on particular bandwidths of interest once EMI signals in those bandwidths are identified. In particular embodiments, the processing device may look at particular bandwidths of interest based on a desired functionality, for example bandwidths at which a device of interest transmits characteristic EMI signals. In particular embodiments, a processing device may determine changes in EMI signals by subtracting background signals or previously received EMI signals from currently received EMI signals.

This disclosure contemplates that any suitable hardware, software, or both may perform any of the signal processing and analysis steps discussed herein. Moreover, this disclosure contemplates that device 230 may be all or part of any object that can couple to the user, either directly or capacitively. In particular embodiments, certain components or aspects described as being performed by device 230 or specific components of device 230 may be distributed across a number of devices. For example, a device may include one or more electrodes for receiving a signal and a transmitter for communicating the signal to one or more computing devices for all or certain processing steps. Device 230 may be part of a network of interconnected computing devices, and signal acquisition, processing, analysis, and classification may be distributed across one or more other computing devices, performed by device 230, or any suitable combination thereof.

Device 230 may include one or more components for classifying an EMI signal. For example, device 230 may identify an object, such as device 210, generating EMI signals; may identify an interaction between user 240 and device 210, such as a contact or proximity of user 240 to device 210 or a gesture performed by user 240; may locate a portion of device 210 at which an interaction with user 240 occurs; may identify an object (in this example, user 240) to which it is coupled; or any suitable combination thereof.

In particular embodiments, device 230 may perform one or more calibration procedures. For example, to locate the position of a touch event on device 210, device 230 may instruct the user to touch device 210 at a particular location. Device 230 may analyze and record the resulting received EMI signal and associate the signal with the calibration event. As another example, the device may instruct the user to position the device on a certain body part, analyze and record the resulting received EMI signal, and associate the signal with that particular body part. As another example, the device may instruct the user to enter a particular room or physical location, analyze and record the resulting received EMI signal, and associate the signal with that particular room or location. As another example, the device may instruct the user to directly couple or capacitively couple the device to the user, analyze and record the resulting received EMI signal, and associate the signal with direct or capacitive coupling, respectively. In particular embodiments, the device may provide a user interface for the user to input particular calibration events or conditions. For example, the device may receive feedback from a user indicating that the user is interacting with a particular device, is performing a particular interaction (e.g., gesture), is in a particular location, is performing a particular activity (e.g. exercising), that a particular condition exists (e.g. that the user is sweating, that it is raining outside, etc), or the like. In particular embodiments, the device may provide pre-set calibration events for a user to select. In particular embodiments, the device may allow a user to enter the user's own customization event. In particular embodiments, a device may include or have access to data from one or more calibration procedures performed with one or more test devices, users, environments, and/or conditions. For example, device 230 may include or have access to EMI signals from commonly used smart phones or a range of user characteristics (e.g., age, body size or type, etc).

In particular embodiments, device 230 may calibrate to a specific user based on the user's body impedance. For example, device 230 may transmit one or more test signals between two or more electrodes coupled to the user's body and determine the impedance based on the transmitted and received signals. In particular embodiments, the calibration may be context dependent, and one calibration may be performed and recorded when the user is exercising and another when the user is sitting still. In particular embodiments, device 230 may perform multiple calibrations, and thus impedance measurements, each corresponding to a particular frequency or frequency range. In particular embodiments, such calibrations may be stored in a profile for the user. In particular embodiments, recent calibrations may be combined with past calibrations to enhance accuracy. In particular embodiments, more recent calibrations may be weighted more highly than older ones.

In particular embodiments, the results of a calibration may be used to provide feedback to a user; adjust signal processing, analysis, or characterization, or both. For example, if a calibration indicates that an electrode is not making good contact with a user, the user may be notified of that fact. As another example, device 230 may adjust the gain of a received signal, for example to ensure that the signal stays within a particular amplitude. In addition or the alternative, device 230 may: adjust the sampling rate used to acquire an EMI signal; may adjust cutoff frequencies used to detect or process an EMI signal; may perform undersampling, or any suitable combination thereof.

In particular embodiments, EMI signals may be used to sense a context surrounding the device 230 or the user. For example, at home the user may surrounded by EMI from a TV, mobile phone, and refrigerator, while at an office the user may be surrounded by EMI from a desktop computer, office lighting, and office phone system. Received EMI signal can thus be compared it to a data store associating EMI signals with particular noise, environments, and locations. In particular embodiments, similarities between the received EMI signal and signals in the data store may be used along with machine learning algorithms to deduce the user's context, such as location and other environmental factors. Different locations may have very different noise contexts. For example, a break room may include EMI from the coffee machine, while a meeting room may include EMI from a large TV or projector, and as FIG. 1 illustrates, those devices may each produce identifiably distinct EMI signals.

Figure 5:
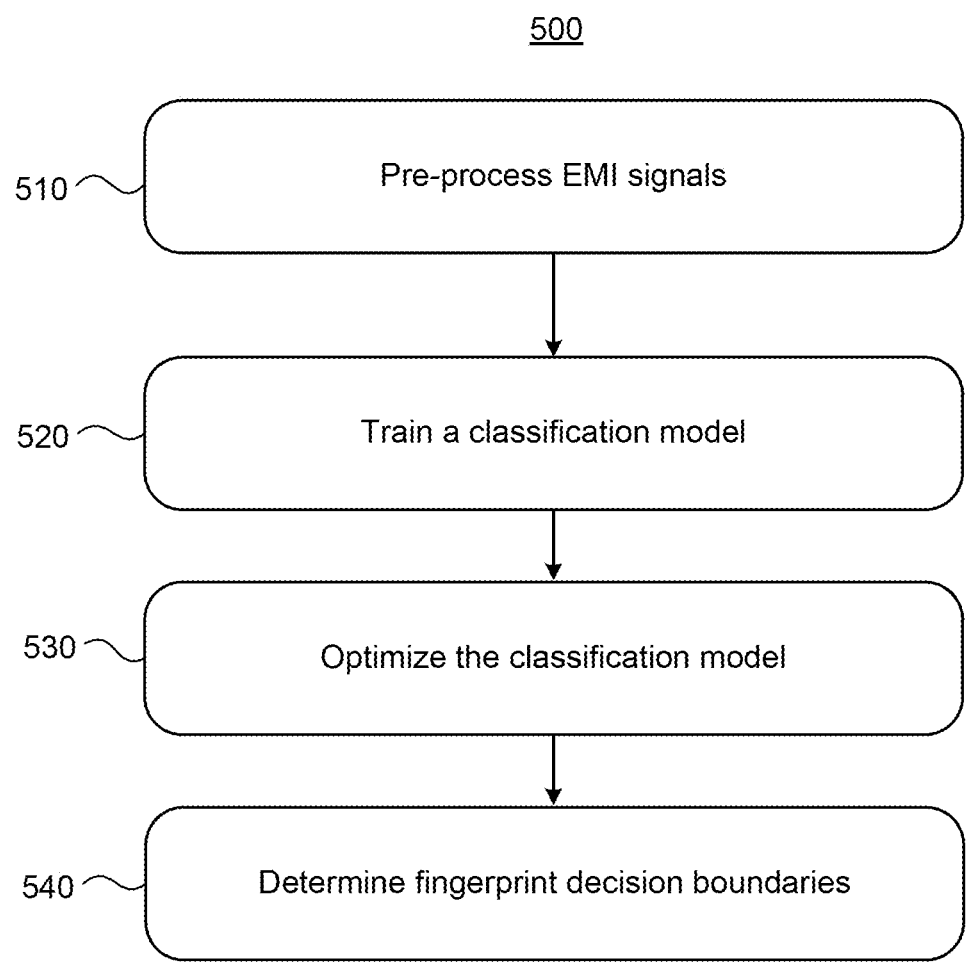
FIG. 5 illustrates an example method for processing, analyzing, and classifying EMI signals.

FIG. 5 illustrates an example technique 500 for processing, analyzing, and classifying EMI signals, for example to identify devices, differentiate between portions of devices, or determine proximity to a device (including contact with a device). Particular embodiments of method 500 may include machine learning techniques, as described more fully herein.

Method 500 may begin at step 510, in which preprocessing of EMI signals occurs. This disclosure contemplates any suitable pre-processing may be performed, including some or all of the steps of method 400 and the techniques described herein. After pre-processing is performed, method 500 may include step 520 for training a classification model used to classify EMI signals. For example, step 520 may include labeling EMI signals or particular aspects thereof according to the class in which those signals belong. A class may be one or more samples of a particular fingerprint. A fingerprint is data representative of a device and, in particular embodiments, a particular context. In particular embodiments, a fingerprint may be EMI signals (or aspects thereof) that are characteristic of a particular device, such as a particular washing machine or tablet. In particular embodiments, a fingerprint may be EMI signals (or aspects thereof) that are characteristic of a particular location and/or a particular device in a particular location. For example, one fingerprint may be characteristic of a user's tablet in the user's living room (determined, for example, based on sensor data such as EMI signals (or lack thereof) from other devices in the user's living room) and another fingerprint may be characteristic of the same tablet but in the user's bedroom (again based on sensor data such as EMI signals (or lack thereof) from other devices in the user's bedroom). In particular embodiments, a fingerprint may be characteristic of a particular device at a particular time. For example, one fingerprint may correspond to an air conditioner during the afternoon (when the air conditioner is likely to be experiencing a relatively large load), and another fingerprint may correspond to the air conditioner during the evening (when the air conditioner is likely to be experiencing a relatively lighter load). In particular embodiments, a fingerprint may be characteristic of a particular device over a particular period of time. For example, a fingerprint may correspond to a particular automobile while the engine of that automobile is started. In that example, the fingerprint may correspond to the particular EMI signals (or aspects thereof) generated by the starting engine. In addition or the alternative, the fingerprint may correspond to changes in the EMI signals over time, such as one or more amplitude changes at a particular frequency or range of frequencies (e.g., in a particular frequency bin) over a particular period of time.

This disclosure contemplates that a fingerprint may include any suitable aspects of a device and its context. This disclosure contemplates that multiple fingerprints with different levels of detail may correspond to a particular device and/or contexts. For example, a fingerprint may correspond to "car" generally, another to a particular model of a car, another to a particular instance of that model of car, another to a particular instance in a particular location, another to a particular instance at or over a particular time, and another to a particular instance associated with a particular activity. In particular embodiments, some or all fingerprints associated with a classification model may be predetermined for device 230. In particular embodiments, some or all fingerprints associated with a classification model may be dynamically determined as device 230 is used. For example, a user may indicate a particular fingerprint with a particular level of granularity, and device 230 may associate the EMI signals or aspects thereof coincident with the user input as being characteristic of that fingerprint. As another example, a fingerprint may be dynamically adjusted as additional samples associated with a fingerprint are detected and processed by device 230. While the examples above describe fingerprints based on the EMI signals characteristic of that fingerprint, fingerprints may also include other sensor data.

In particular embodiments, method 500 may include step 530 for optimizing a classification model. Step 530 may include machine-learning techniques to optimize a classification model. For example, several training runs associated with a particular fingerprint may be made in a controlled environment, and the data collected from each training run may be associated with that fingerprint and, in particular embodiments, used to update that fingerprint. As another example, user-end training runs may be used to determine a fingerprint, such as asking the user to walk through particular rooms of the user's house and recording the EMI data associated with each room, or asking the user to contact different portions of a particular device and recording the EMI data associated with each portion. In particular embodiments, affirmative user feedback may be used to optimize a classification model. For example, when device 230 detects EMI signals determined to correspond to a fingerprint, device 230 may provide a GUI to the user asking the user to indicate whether the fingerprint is accurate (e.g., whether a user did just start the engine of a car.) In particular embodiments, lack of negative user feedback may be used to optimize a classification model. For example, one or more inputs, such as a particular gesture, may allow a user to "undo" a fingerprint determination and/or functionality associated with that determination. A fingerprint determination may be determined to be accurate unless a user has provided input undoing that determination or functionality associated with that determination. In particular embodiments, EMI signals determined not to correspond to any stored fingerprint may be discarded. In particular embodiments, data associated with several devices 230 may be collected and used to optimize a classification model. For example, fingerprints (perhaps from two different users) associated with two separate instances of a particular television model may be used together to update a fingerprint for that television model. While this disclose describes example techniques for model optimization, this disclosure contemplates that step 530 may include any suitable model optimization techniques.

Method 500 may include step 540, which calculates decision boundaries for a classification model. In particular embodiments, step 540 may include determining the boundaries in an N-dimensional space corresponding to N-frequency bins used for classifying an EMI signal. In particular embodiments, step 540 may include determining the boundaries in a subset of the N-dimensional space, for example using PCA techniques described more fully above. In particular embodiments, each dimension of the N-dimensional space may correspond to the subset of frequencies ranges of interest. In particular embodiments, LCA may be used to differentiate the boundaries corresponding to different fingerprints. In particular embodiments, step 540 may be performed dynamically while device 230 is in operation. For example, EMI signals detected by a device may be determined to correspond (or not to correspond) to a particular fingerprint. That determination may be used to update the dimensions of interest in the N-dimensional space, to update the boundaries between one or more fingerprints, or both.

Although this disclosure describes and illustrates particular steps of the method of FIG. 5 as occurring in a particular order, this disclosure contemplates any suitable steps of the method of FIG. 5 occurring in any suitable order. Moreover, this disclosure contemplates any suitable method for processing, analyzing, and classifying EMI signals including any suitable steps, which may include all, some, or none of the steps of the method of FIG. 5. Furthermore, although this disclosure describes and illustrates particular components, devices, or systems carrying out particular steps of the method of FIG. 5, this disclosure contemplates any suitable combination of any suitable components, devices, or systems carrying out any suitable steps of the method of FIG. 5.

In practical embodiments, EMI signals detected by device 230 are evaluated against the classification model constructed by method 500. In particular embodiments, such signals may be evaluated by preprocessing raw EMI signal and evaluating the fingerprint(s) that the signal belongs to (if any) by evaluating the preprocessed signal against the N-dimensional space (or subset of N-dimensional space) constructed by method 500. As described above, EMI signals may also be used to update the classification model constructed by method 500.

In particular embodiments, one or more devices may use estimated context to provide particular functionalities. For example, when a user approaches a printer, queued documents may be automatically printed. As another example, a shared device, such as a display for displaying presentations, may be automatically controlled by a user when the user is near the device. In particular embodiments, a user may configure functionalities associated with a particular context. For example, a user may input rule that are triggered or are in part based on a particular context being sensed. While the examples above discuss context in terms of location and the presence of electronic devices, this disclosure contemplates detecting context from any suitable signals from any suitable object, such as the humidity, a user's activity rate, a time of day, or any other suitable context of the user.

In particular embodiments, device 230 may communicate with device 210. For example, device 210 may transmit communication signals encoded in EMI signals to device 230. Device 210 may generate such signals by, for example, modifying the display (e.g. turning on and off at least a portion of the display, dimming at least a portion of the display, etc.), turning a Wi-Fi module or Bluetooth module on and off, or enabling or disabling any particular circuitry in a predetermined pattern. On high framerate displays, modification of the display may be done in between frames of the visual content. In particular embodiments, the frequency of the communication signals may be in a predetermined portion of the electromagnetic spectrum. As explained by these examples, device 210 may communicate with device 230 using device 210's existing hardware, even if one or both devices are not capable of communicating using a particular communications technology. In particular embodiments, both devices may execute or access software identifying a predetermined protocol for encoding and decoding communication signals.

In particular embodiments, device 230 may communicate directly with device 210, for example using a Wi-Fi or Bluetooth connection. In particular embodiments, device 230 may sense and identify device 210 and establish a communication session over any suitable communications technology.

In particular embodiments, a piece of hardware may be attached to device 210 to transmit or facilitate transmission of EMI signals. For example, the hardware may include resonators that amplify and filter specific frequency components from the device. Such hardware may include dongles, stickers, tags, or any other suitable hardware.

EMI signals received by device 230, whether in raw or processed form (such as signals processed according to method 400 of FIG. 4, method 500 of FIG. 5, or both) may be used for a number of functionalities. For example, such signals may be used to identify the source of the EMI signals, communicate with the source, identify a user, identify a context of the user or device 210, or any other suitable functionality. In particular embodiments, functionality may be provided by comparing received signals or aspects of received signals to reference data in a data store associating functionality with particular EMI signals or particular aspects of those signals. This disclosure contemplates that such data may take any suitable form, such as a profile for device 210, a profile for a device or object generating the EMI signals, a profile for user 240, a profile for the surrounding context, a record in a database, or any suitable combination thereof. Based on the comparison, a device making the comparison, which may be device 230 or any other suitable computing device, may determine to initiate a particular functionality, ignore the signal, store the signal, perform further processing on the signals, characterize the signals as noise, or any suitable combination thereof. In particular embodiments, device 230 may include all or some of the reference data. In particular embodiments, data stored by device 230 may be particular to the user, e.g. based on calibration described above. In particular embodiments, reference data may be stored on any suitable computing device. In particular embodiments, data may be representative of an aspect of a user 240, such as based on training performed with, or data collected from, a set of users having one or more similar characteristics (e.g., age, sex, location, etc.) to user 240. In particular embodiments, signals or characteristics of signals may be stored and used to refine reference data. In particular embodiments, data may be used by machine learning algorithms to revise data to ensure more accurate classification of EMI signals and signals characteristics. In particular embodiments, such algorithms may use input from a user, such as input indicating whether a particular functionality should have been or should not have been performed in response to a particular signal.

As described above, EMI signals received by a device can be used to identify the source of the EMI signals at the object (e.g., device), circuit, or component level. Using EMI signals to identify a source allows identification without requiring signals specifically intended to be used for identification. As described above, the EMI signals (such as PSD information, phase information, or any suitable aspect) characteristic to particular objects may be stored using any suitable data structure. In particular embodiments, a user can also add devices to the database by explicitly identifying one or more devices that are transmitting EMI signals to the receiving device. The receiving device (or any other suitable computing device) may then correlate the signals with the identified device. In particular embodiments, data characteristic EMI signals of a device may be determined by testing the device, or a representative device similar to the device, identifying the resulting EMI signals, and storing the signals or aspects of the signals in connection with the identification of the device. In particular embodiments, such data may be included on device 230, may be stored in a location accessible by several different devices 230 (such as in a database on a server device), or both.

In particular embodiments, device identification may take into account any other suitable data, such as context, the identity of a user, or both. In particular embodiments, a device's state or mode of operation may be identified along with or as an alternative to device identification. For example, a device's operational state, i.e. the components operating within the device and the particular mode of operation of those components, may be identified from EMI signals. For example, display patterns on a display or inductors such as Bluetooth or Wi-Fi modulations may be sensed based on the EMI signals particular to those components during particular modes of operation.

In particular embodiments, device identification may be used to provide notifications to a user. For example, a user could associate reminders or notes with particular devices. For example, a user contacting a coffee machine may be reminded of upcoming appointments, to buy more coffee, or the like. In particular embodiments, device identification may be used in association with device state information to provide functionality to a user. For example, device 230 may detect a change in EMI signals from a device such as an oven or washing machine indicating that the device has finished operating. Thus, the user may be informed that the oven has finished cooking or that the washing machine has finished its wash cycle. As another example, device 230 may track a length of time of an operational state of a device, such has the amount of time a television, computer, or video game console has been powered on. In particular embodiments, device and state identification may be used to log data regarding a device's operation. Such logs may include when an event, such as data transfer, happens, for how long it happens, how frequently it happens, etc.

In particular embodiments, device and state information may be used along with communication between devices to provide personalized functionality. For example, device 230 could identify a particular device and its state, and then communicate the identity of itself or an associated user to the identified device. The device generating the EMI signals may then access settings or other data that customizes the user's experience. For example, a coffee machine could brew a user's predetermined brew, a television set could tune to a predetermined channel, etc. As another example, a device generating EMI signals may not have touch capability itself but may detect touches communicated from device 230. Device 230 may detect contact between the user and the device generating the EMI signals and then communicate such contact to the device. The device may then display content or provide functionality in response to the communicated contact event. In particular embodiments, device 230 may use detected EMI signals to determine a background noise level for use by other devices or sensors. For example, information about sensed EMI signals may be used to enhance a GPS location or tune a communication channel in a noisy environment.

Figure 6:
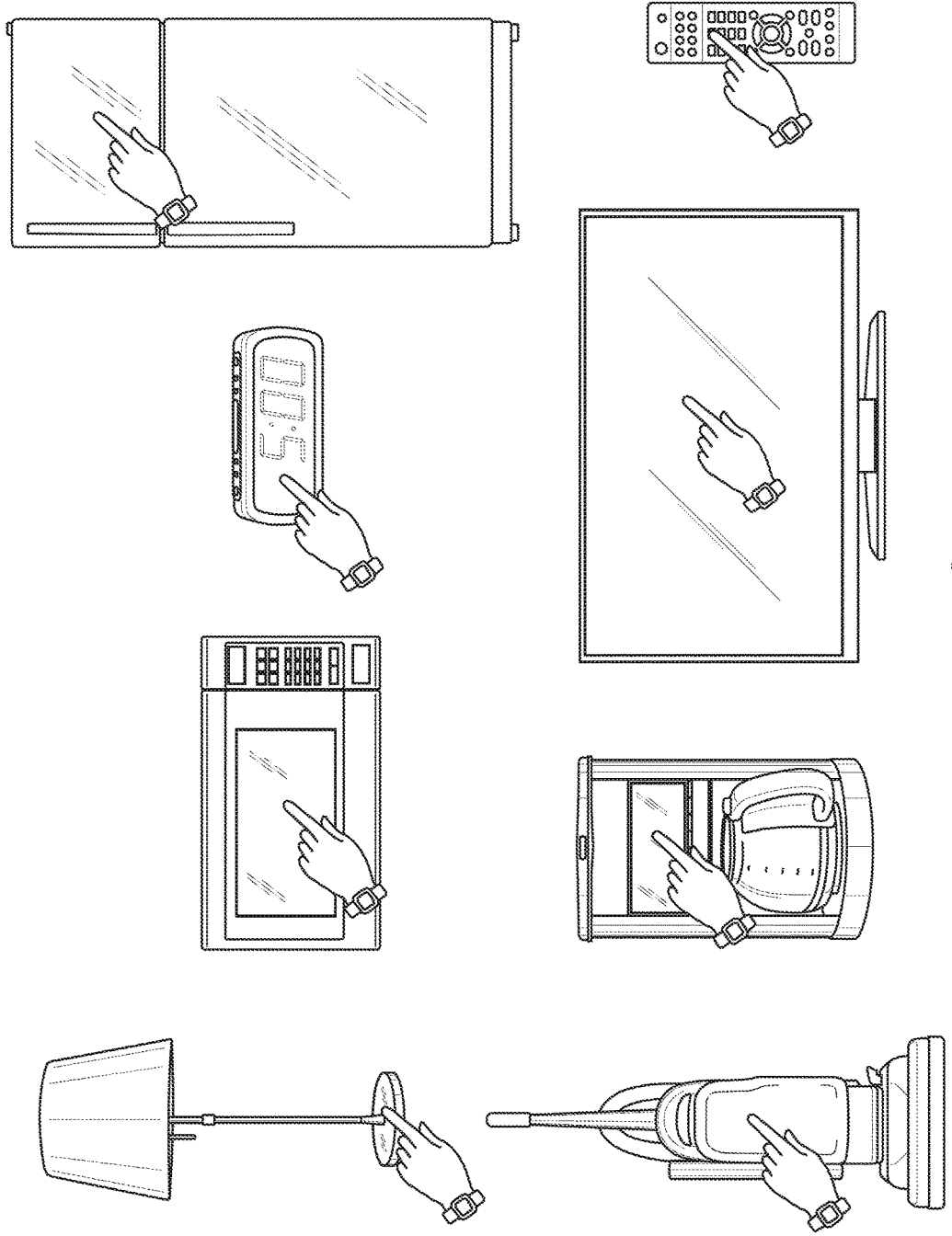
FIG. 6 illustrates touch detection on devices that do not contain touch-detection capabilities.

In particular embodiments, device 230 may detect a user's contact with or proximity to (such as hovering near) another device transmitting EMI signals. Thus, the transmitting device may be provided with touch-sensitive functionality, even if that device does not itself contain touch-sensitive technology. FIG. 6 illustrates contact between a user wearing device 230 and a number of common household devices that generate EMI signals. Contact with those devices may be sensed by device 230, even though such devices do not themselves have touch-sensitive capabilities.

In particular embodiments, a touch or interaction event may be localized to a specific portion of a device. For example, EMI emissions may not be uniform along the physical dimensions of a device, for instance because the hardware that is emitting them is placed at different physical locations in the device. By analyzing the EMI signals captured by the user's body when touching or coming near a device, the specific portion of the device the interaction is on or near may be determined based on the uniqueness of the EMI signal.

In particular embodiments, device 230 may detect and differentiate between contact and near-contact interactions, such as gestures performed in contact with a display compared to gestures performed above a display, by: adjusting the gain of a received EMI signal; adjusting the sampling rate used to acquire an EMI signal; adjusting cutoff frequencies used to detect or process an EMI signal; performing undersampling, or any suitable combination thereof. Thus, devices without touch-sensitive technology may be provided with three-dimensional gesture functionality due to detection by device 230 of proximity, including gestures. In particular embodiments, proximity and contact measurements may be combined with output from other sensors, such as an accelerometer or any other suitable sensor on device 230, to detect gestures.

This disclosure contemplates that any device that generates EMI signals may be provided with any suitable touch functionality. For example, device 230 may warn a user when the user comes near a device, such a high-temperature or high-voltage device. As another example, a user may interact with content displayed on a device. Device 230 detects contact and communicates the contact to the touched device, which then executes the appropriate functionality. Gesture functionality that incorporates touch or hovering may also be detected. For example, a user may navigate among slides of a displayed slideshow by performing swiping gestures, which are sensed by device 230 due to changes in EMI received as the user moves relative to the displaying device. Such gestures may be sensed by any suitable sensor in addition to the electrodes sensing EMI coupled to the user, such as for example an accelerometer or a gyroscope. In particular embodiments, touch detection may be combined with device identification to provide functionality to a user, such as device-specific notifications once the user comes near or into contact with the device.

In particular embodiments, a device's circuitry, such as transducer circuitry, may be used to encode and transmit messages in EMI signals to device 230. For example, state changes in circuitry (such as turning on or off, or entering a sleep mode) create a change in the detected EMI signal. Intentional modulation of such signals may thus encode EMI signals with communications to device 230. For example, a device's display may flash different colors at different intervals, may have speakers that create sounds at different frequencies (audible, inaudible, or both) in different intervals, may switch on or off components such as a fingerprint reader at certain intervals, or any other suitable modulation.

In particular embodiments, communication may be used for device or user authentication. For example, a device and device 230 may be paired by a communication channel, such as for example Bluetooth. The user may contact the device, such as the screen of the device, which may turn on the screen and triggers the screen to flash a certain pattern using different colors. The flashing can happen at the portion of the screen underneath the finger contacting the screen, thus making the process invisible to the user. This pattern generates EMI signals that couple to the user and are thus received by device 230, which decodes the signals and sends an unlock token to the device over the Bluetooth connection. The device in this example may be any suitable device, such as for example a mobile phone, a tablet, a laptop, a desktop computer, a vehicle, a door or gate entry system, or any other suitable device. In particular embodiments, authentication may involve loading particular settings or data associated with device 230, the user coupled to device 230, or both. In particular embodiments, device 230 may act as a repository for the passwords and unlock tokens of its associated user. For example, a user's passwords associated with different devices and sources of EMI may be loaded onto device 230 and used to automatically unlock the devices when their presence is sensed by device 230. This disclosure contemplates that communication may be unidirectional or bidirectional, as appropriate.

In particular embodiments, encoded signals may be used to transmit particular information about the device generating EMI signals. For example, the device may transmit its MAC address by switching transducers in a predetermined way. Device 230 may use the identifying information to perform automatic device identification and pairing. In particular embodiments, a user may identify particular content to transfer to a target device, which may be paired with device 230 over any suitable communication scheme. The user may then touch the target device that is to receive the data. The target device transmits identifying information, such as its MAC address, by encoding a signal using any suitable circuitry modulating EMI signals. Device 230 may then establish a communication between a source device transmitting the data and the target device. In particular embodiments, the source device may be device 230. In particular embodiments, source device may be another device communicating with device 230, which instructs the source device to establish a communication with the target device and/or transmit data to the target device. As this example illustrates, device 230 may initiate and/or act as an intermediary for communications between two or more other devices.

In particular embodiments, detected EMI signals may be used to locate a device emitting EMI signals and, in particular embodiments, locate a user relative to the detected device. For example, such signals may be used to create or improve a map of a region in which the detected device is located. If a detected device is at a known location (e.g., "bookshelf in living room," "kitchen," "home," etc.) then information about that device's location may be used to create a map of the user's environment and/or locate a user in the environment. In particular embodiments, location signals may be used in connection with other data, such as GPS data, Wi-Fi router data, cell tower data, or the like to improve locating a user and objects in the user's environment. This disclosure contemplates locating a device or user, or mapping a user's environment, based on any suitable location data associated with a detected device, including data about a room the device is in, a location in a room the device is in, a building the device is in, or particular location coordinates (such as latitude and longitude) of the device. This disclosure contemplates that such location data may have any suitable level of granularity. In particular embodiments, location data may be used to locate a user and provide a map of the user's environment to the user. In particular embodiments, location data may be used to create or supplement a map of a user's environment or locate a user relative to a particular location or device. In particular embodiments, location data associate with a detected device may be used to enhance determinations of a user's location when GPS signals are weak, such as when a user is indoors.

In particular embodiments, one or more users may be interacting with a touch-sensitive device. Information from the touch-sensitive device and a second device held or worn by the user may be used to identify the users, associate the users with particular interactions, or both.

In particular embodiments, a second device may be a device capable of detecting EMI signals transmitted by the user's body, for example device 230. For example, the second device may pair with a touch-sensitive device over a communication link, such as Bluetooth. The touch-sensitive device may detect a touch event and associate context data such as a timestamp with the touch event indicating the time at which the touch event occurred. The second device may detect an EMI signal indicating that contact with a device has occurred and, if not already done, may identify the device as the touch-sensitive device. The second device may then associate context data such as a timestamp with the contact indicating when the contact occurred. The second device may communicate the timestamp to the touch-sensitive device, which may then compare the received timestamp with the timestamp associated with the touch event it detected. If the two timestamps are sufficiently similar e.g., within a certain amount of tolerance) then the touch-sensitive device may conclude that the touch event and detected contact represent the same event. Thus, the user associated with the event may be identified, either by assigning the user or second device an id, by receiving information form the second device identifying the user or device, or any other suitable means. While this example describes the touch-sensitive device as receiving and comparing the timestamps, this disclosure contemplates that the touch-sensitive device may communicate its timestamp to the second device, which may perform the comparison. This disclosure further contemplates that each device may send its timestamp and any other suitable information to another device, such as a server or a user's smart phone, which may perform the comparison or forward the information to any other device to perform the comparison.

In particular embodiments, a timestamp may be associated with a touch event at a particular point during a continuous touch event, such as at when contact is first started. It particular embodiments, a timestamp may identify a time of contact of each of several points of contact during a continuous touch event. For example, a timestamp could record a time of contact at regular intervals as a function of time or distance moved relative to a touch-sensitive surface. In particular embodiments, a timestamp may record duration of a contact with a touch-sensitive device. For example, a timestamp may start recording when contact is first identified and continue recording until the contact ceases. In particular embodiments, a timestamp may identify a time associated with each point of contact in a multi-touch event, such as a multi-touch gesture. For example, if the second device in the example above senses EMI signals, then each point of contact from a multi-touch gesture may be sensed, as more surface area of the skin in contact with a device results in higher amplitude of the resultant EMI signal. Moreover, contact and separation may be detected based on the EMI signals even when the user is stationary.

The examples above associate a timestamp with a touch event to determine whether a touch event is attributable to a particular user. A timestamp is one example of context data that may be used to associate a touch event with a user. Any suitable time-dependent sensor reading may be used as context data to match touch events sensed by a touch device with touch events sensed by a second device, such as a user's wearable device. For example, time-dependent sensor data from an accelerometer, microphone, or magnetic-field sensor may be used to associate a touch event with a user. For example, the impulse of a user's touch event may be detected by a touch-sensitive device. That signal may be compared to accelerometer data captured by a wearable device on a user as the user's hand moves towards and on the touched device. As another example, the motion of a user's hand contacting and lifting from a touch device may be detected by, e.g., an accelerometer of a wrist-worn device, and that motion may be compared to touch events and the duration of touch events detected by a touch sensor, as the touch events detected by the touched device should be sandwiched in time between the movement of the user's hand to the touch device and the movement of the user's hand from the touch device. As another example, a microphone on a wearable device may detect sounds waves generated by a touch event, and the touch event detected from that signal may be compared to a touch event detected by the touch device. This disclosure contemplates that any suitable time-dependent sensor data may be used in addition or as an alternative to timestamps to detect touch events. This disclosure contemplates that any such sensors or combination of sensors may be incorporated in or on a touched device or a wearable device, or both.

In particular embodiments, the identity of a user associated with a touch event may be used to customize a user experience, for example by loading or executing user-specific data when the user is identified. Such data may include specific settings, applications, and content. For example, a user's password keychain may be accessed when the associated user is identified. As another example, applications a user has purchased or installed on a device may be loaded onto the touched device. As another example, user-specific data within an application, such as the user's emails, may be loaded or accessed when the associated user is identified. As another example, user identification may automatically log the identified user into the device, and may do using a profile or other data specific to the user. As another example, a user's preferences such as a background image, screen brightness, volume setting, etc. may be loaded. As another example, a content filter may be used, for example when a user is identified as a child. As another example, touch events may be cancelled if they result from a user that is not authorized to interact with the device or to access the requested data or perform the requested functionality associated with the touch event. In particular embodiments, detecting an unauthorized user may result in an unlocked device becoming locked.

As an example of functionality associated with user identification, a first user may contact a touch-sensitive device. The contact may be detected by a second device, such as device 230, and the user may be identified, for example using the procedures described above. The first user may open an email application on the device, and the device may load the first user's emails accordingly. If a second user comes into contact with the device and opens the email application, that user may be identified and the second user's email loaded accordingly. In particular embodiments, the device may access the user's information from a user's profile stored on another device, such as a server. In particular embodiments, the user's information may be stored on the touched device. In particular embodiments, the user's information may be stored on the second device.

In particular embodiments, user identification may enhance shared devices, applications, and data. For example, annotations on shared documents may be distinguished among identified users.

In particular embodiments, two or more users may be interacting with a device at the same time. Each user interacting with a device may be identified using the example described above, so long as each user has a second device, such as device 230, associated with that user. More generally, N users may be identified as long as N−1 users have an associated second device.

Figure 7:
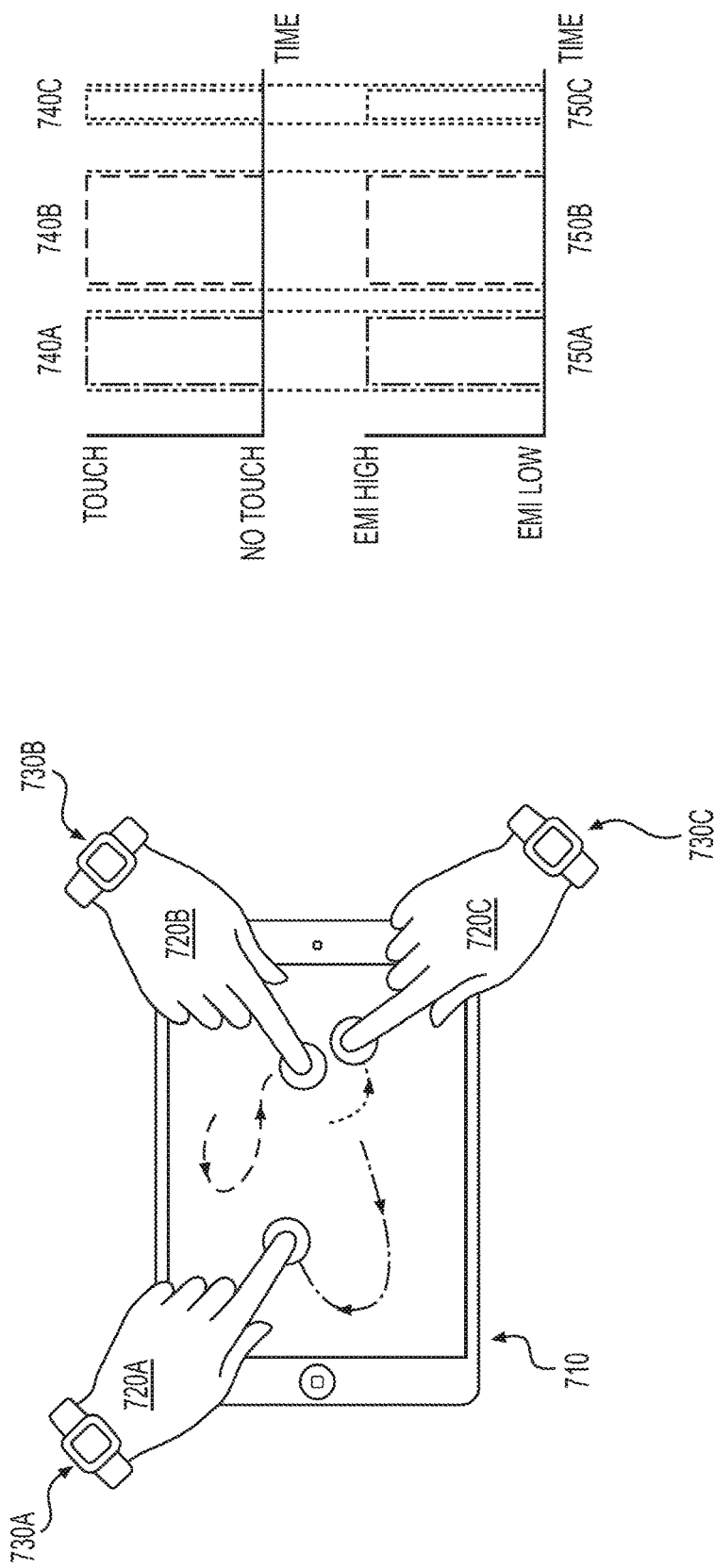
FIG. 7 illustrates an identification of multiple users interacting with a touch-sensitive device.

FIG. 7 illustrates example identifications of several users simultaneous interacting with a touch-sensitive device. As illustrated in FIG. 7, each of users 720A, 720B, and 720C are generating touch events on a shared device such as touch-sensitive device 710. Each user is wearing an example device, wristwatch 730A, 730B, and 730C, respectively. Each user's touch interactions as determined by device 710 is associated with context data such as a timestamp indicating, e.g., a time of first contact, last contact, a duration of contacts, or the like. At the same time, each of devices 730A, B, and C are recording contact events and associating context data such as timestamps with the contact events. As illustrated in FIG. 7, a timestamp associated with contact 750A determined by device 730A for user 720A corresponds to a timestamp associated with contact 740A determined by device 710 for the touch event generated by user 720A. Timestamps associated with contact 750B and 750C likewise correspond to timestamps associated with contact 740B and 740C, respectively. Thus, device 710, devices 720A-C, or any other suitable device may identify particular touch events with particular users based on the correspondence between timestamps for contacts 750A-C and timestamps for contacts 740A-C. In particular embodiments, device 710 may provide different output or functionality based on the user's identity. For example, device 710 may assign each user an input color, and a user's touch input on a display of device 710 may be displayed using that user's assigned color. This disclosure contemplates that the touch and time measurements may take any suitable form, including but not limited to the touch and time measurements illustrated in FIG. 7. While the example of FIG. 7 illustrates touch events occurring sequentially in time, this disclosure contemplates that touch events occurring simultaneous—or touch events that include a combination of sequential and simultaneous touch events—may be differentiated using the techniques described herein.

Figure 8:
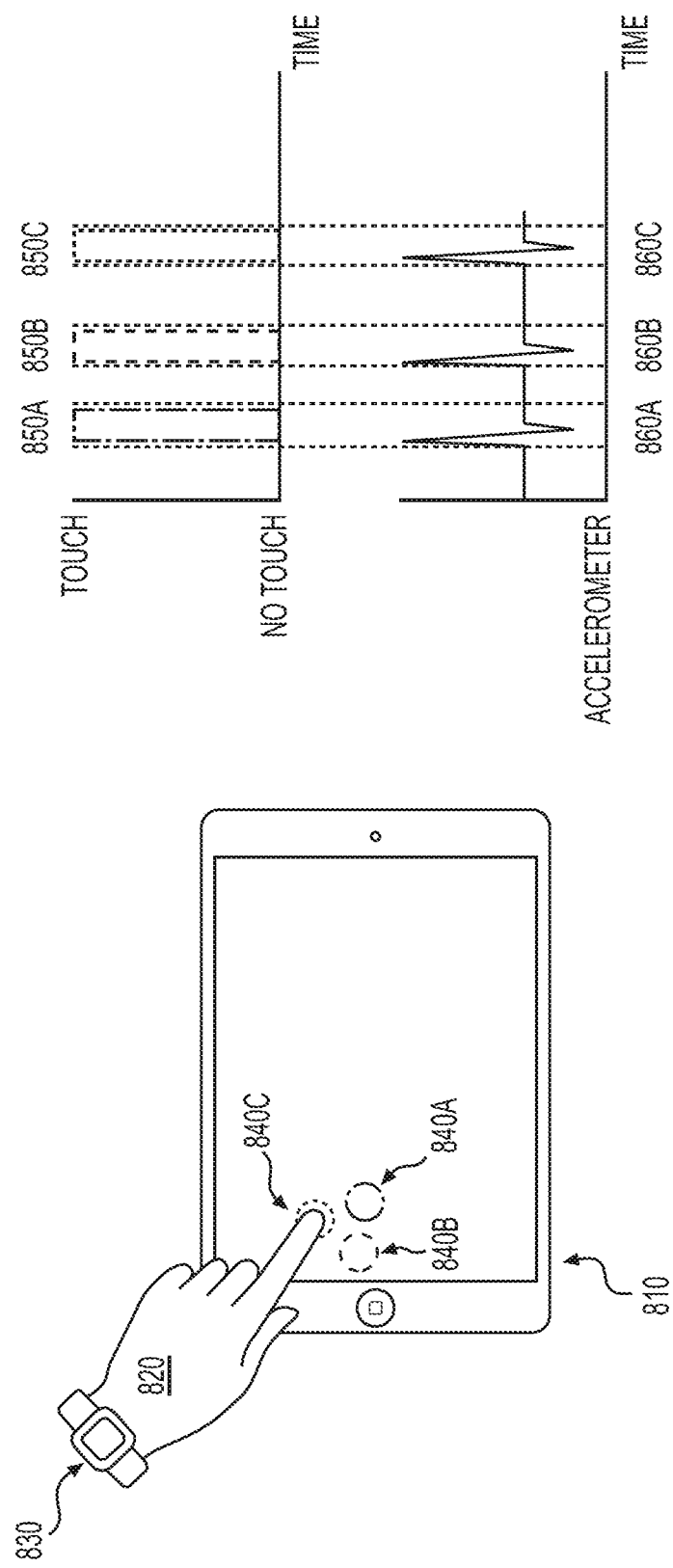
FIG. 8 illustrates an identification of a user interacting with a touch-sensitive device.

Contact between a user and the touch-sensitive device can be detected using multiple on-board sensors in the second device. While the examples above discuss detecting contact using an EMI sensor, this disclosure contemplates detecting contact using any suitable sensor or combination of sensors, such as for example an accelerometer, microphone, or magnetic-field sensor. In particular embodiments, the contact sensed by the sensor is associated with a timestamp, and that timestamp is compared to a timestamp associated with a contact event detected by the touch-sensitive device. FIG. 8 illustrates an example identification of a user using data from an accelerometer of example device 830. As indicated in FIG. 8, user 820 wearing a wristwatch 830 and is interacting with device 810. User 820 creates touch events 840A-C. Device 810 records touch events and associates timestamps with recorded contacts 850A-C that correspond to the touch events. In addition, an accelerometer of device 830 detects touch events 840A-C and associates timestamps based on accelerometer data 860A-C. Each touch event may be associated with the user by comparing the timestamps recorded by device 810 and device 830. In particular embodiments, an application or functionality may require multiple tap events, as illustrated in FIG. 8, to aid in identification of a particular user. For example, a user may be asked to tap a display three times in order to log in to the device or access user-specific content, such as the user's emails.

In particular embodiments, lag between touch events detected by a touch-sensitive device and a second device may be determined in order to accurately associate touch events. Lag may occur due to different processing speeds associated with different sensing technologies, to clocks that are not completely synchronized, to delays in communication of timestamps or other context data, or any suitable combination thereof. In particular embodiments, lag may be determined for a particular device or sensing technology during a calibration event, for example by asking a user to contact a display and comparing the difference in two timestamps each associated with two different sensing technologies. In particular embodiments, one or more offsets may then be applied to timestamps associated with one or both sensing technologies to synchronize the sensing technologies.

In particular embodiments, a timestamp may be a notification that a touch event has been detected, i.e. the notification may itself be a timestamp indicating that a touch event has just occurred. In that embodiment, a lag in communication may be determined to account for the difference between the time of detection and the time the notification is received. For example, a touch-sensitive device and a second device may pair using, for example, a Wi-Fi connection. The touch-sensitive device may request a notification from the second device and compare the time of the request to the time the notification is received. The touch-sensitive device may use the difference between the two times to determine an appropriate, synchronizing offset.

Figure 9:
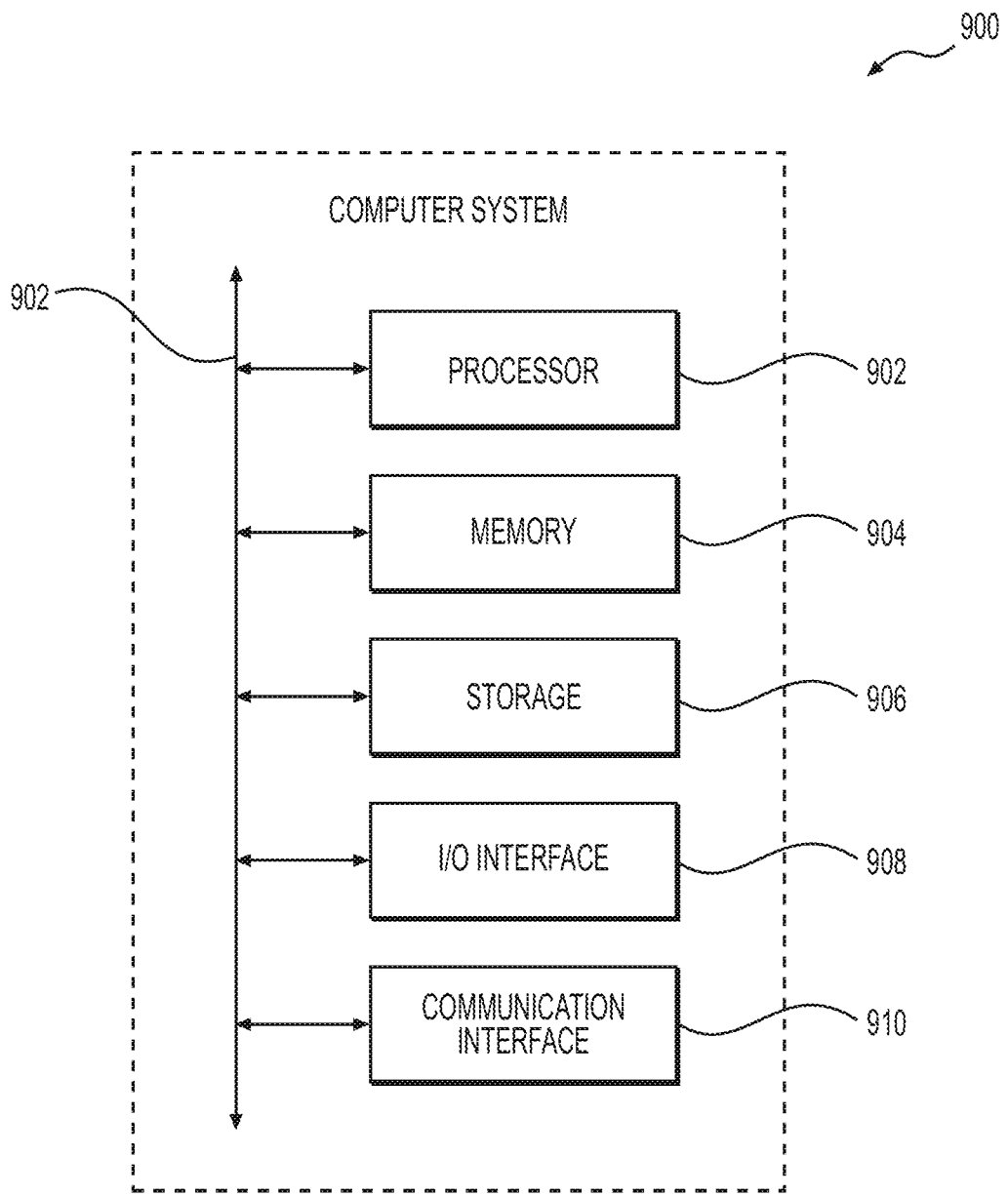
FIG. 9 illustrates an example computer system.

FIG. 9 illustrates an example computer system 800. In particular embodiments, one or more computer systems 800 perform one or more steps of one or more methods described or illustrated herein. The processes and systems described herein may be implemented using one or more computer systems 800. In particular embodiments, one or more computer systems 800 provide functionality described or illustrated herein. In particular embodiments, software running on one or more computer systems 800 performs one or more steps of one or more methods described or illustrated herein or provides functionality described or illustrated herein. Particular embodiments include one or more portions of one or more computer systems 800. Herein, reference to a computer system may encompass a computing device, and vice versa, where appropriate. Moreover, reference to a computer system may encompass one or more computer systems, where appropriate.

This disclosure contemplates any suitable number of computer systems 800. This disclosure contemplates computer system 800 taking any suitable physical form. As example and not by way of limitation, computer system 800 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, a tablet computer system, or a combination of two or more of these. Where appropriate, computer system 800 may include one or more computer systems 800; be unitary or distributed; span multiple locations; span multiple machines; span multiple data centers; or reside in a cloud, which may include one or more cloud components in one or more networks. Where appropriate, one or more computer systems 800 may perform without substantial spatial or temporal limitation one or more steps of one or more methods described or illustrated herein. As an example and not by way of limitation, one or more computer systems 800 may perform in real time or in batch mode one or more steps of one or more methods described or illustrated herein. One or more computer systems 800 may perform at different times or at different locations one or more steps of one or more methods described or illustrated herein, where appropriate.

In particular embodiments, computer system 800 includes a processor 902, memory 904, storage 906, an input/output (I/O) interface 908, a communication interface 910, and a bus 812. Although this disclosure describes and illustrates a particular computer system having a particular number of particular components in a particular arrangement, this disclosure contemplates any suitable computer system having any suitable number of any suitable components in any suitable arrangement.

In particular embodiments, processor 902 includes hardware for executing instructions, such as those making up a computer program. As an example and not by way of limitation, to execute instructions, processor 902 may retrieve (or fetch) the instructions from an internal register, an internal cache, memory 904, or storage 906; decode and execute them; and then write one or more results to an internal register, an internal cache, memory 904, or storage 906. In particular embodiments, processor 902 may include one or more internal caches for data, instructions, or addresses. This disclosure contemplates processor 902 including any suitable number of any suitable internal caches, where appropriate. As an example and not by way of limitation, processor 902 may include one or more instruction caches, one or more data caches, and one or more translation lookaside buffers (TLBs). Instructions in the instruction caches may be copies of instructions in memory 904 or storage 906, and the instruction caches may speed up retrieval of those instructions by processor 902. Data in the data caches may be copies of data in memory 904 or storage 906 for instructions executing at processor 902 to operate on; the results of previous instructions executed at processor 902 for access by subsequent instructions executing at processor 902 or for writing to memory 904 or storage 906; or other suitable data. The data caches may speed up read or write operations by processor 902. The TLBs may speed up virtual-address translation for processor 902. In particular embodiments, processor 902 may include one or more internal registers for data, instructions, or addresses. This disclosure contemplates processor 902 including any suitable number of any suitable internal registers, where appropriate. Where appropriate, processor 902 may include one or more arithmetic logic units (ALUs); be a multi-core processor; or include one or more processors 902. Although this disclosure describes and illustrates a particular processor, this disclosure contemplates any suitable processor.

In particular embodiments, memory 904 includes main memory for storing instructions for processor 902 to execute or data for processor 902 to operate on. As an example and not by way of limitation, computer system 800 may load instructions from storage 906 or another source (such as, for example, another computer system 800) to memory 904. Processor 902 may then load the instructions from memory 904 to an internal register or internal cache. To execute the instructions, processor 902 may retrieve the instructions from the internal register or internal cache and decode them. During or after execution of the instructions, processor 902 may write one or more results (which may be intermediate or final results) to the internal register or internal cache. Processor 902 may then write one or more of those results to memory 904. In particular embodiments, processor 902 executes only instructions in one or more internal registers or internal caches or in memory 904 (as opposed to storage 906 or elsewhere) and operates only on data in one or more internal registers or internal caches or in memory 904 (as opposed to storage 906 or elsewhere). One or more memory buses (which may each include an address bus and a data bus) may couple processor 902 to memory 904. Bus 812 may include one or more memory buses, as described below. In particular embodiments, one or more memory management units (MMUs) reside between processor 902 and memory 904 and facilitate accesses to memory 904 requested by processor 902. In particular embodiments, memory 904 includes random access memory (RAM). This RAM may be volatile memory, where appropriate, and this RAM may be dynamic RAM (DRAM) or static RAM (SRAM), where appropriate. Moreover, where appropriate, this RAM may be single-ported or multi-ported RAM. This disclosure contemplates any suitable RAM. Memory 904 may include one or more memories 904, where appropriate. Although this disclosure describes and illustrates particular memory, this disclosure contemplates any suitable memory.

In particular embodiments, storage 906 includes mass storage for data or instructions. As an example and not by way of limitation, storage 906 may include a hard disk drive (HDD), a floppy disk drive, flash memory, an optical disc, a magneto-optical disc, magnetic tape, or a Universal Serial Bus (USB) drive or a combination of two or more of these. Storage 906 may include removable or non-removable (or fixed) media, where appropriate. Storage 906 may be internal or external to computer system 800, where appropriate. In particular embodiments, storage 906 is non-volatile, solid-state memory. In particular embodiments, storage 906 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 906 taking any suitable physical form. Storage 906 may include one or more storage control units facilitating communication between processor 902 and storage 906, where appropriate. Where appropriate, storage 906 may include one or more storages 906. Although this disclosure describes and illustrates particular storage, this disclosure contemplates any suitable storage.

In particular embodiments, I/O interface 908 includes hardware, software, or both, providing one or more interfaces for communication between computer system 800 and one or more I/O devices. Computer system 800 may include one or more of these I/O devices, where appropriate. One or more of these I/O devices may enable communication between a person and computer system 800. As an example and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 908 for them. Where appropriate, I/O interface 908 may include one or more device or software drivers enabling processor 902 to drive one or more of these I/O devices. I/O interface 908 may include one or more I/O interfaces 908, where appropriate. Although this disclosure describes and illustrates a particular I/O interface, this disclosure contemplates any suitable I/O interface.

In particular embodiments, communication interface 910 includes hardware, software, or both providing one or more interfaces for communication (such as, for example, packet-based communication) between computer system 800 and one or more other computer systems 800 or one or more networks. As an example and not by way of limitation, communication interface 910 may include a network interface controller (NIC) or network adapter for communicating with an Ethernet or other wire-based network or a wireless NIC (WNIC) or wireless adapter for communicating with a wireless network, such as a WI-FI network. This disclosure contemplates any suitable network and any suitable communication interface 910 for it. As an example and not by way of limitation, computer system 800 may communicate with an ad hoc network, a personal area network (PAN), a local area network (LAN), a wide area network (WAN), a metropolitan area network (MAN), body area network (BAN), or one or more portions of the Internet or a combination of two or more of these. One or more portions of one or more of these networks may be wired or wireless. As an example, computer system 800 may communicate with a wireless PAN (WPAN) (such as, for example, a BLUETOOTH WPAN), a WI-FI network, a WI-MAX network, a cellular telephone network (such as, for example, a Global System for Mobile Communications (GSM) network), or other suitable wireless network or a combination of two or more of these. Computer system 800 may include any suitable communication interface 910 for any of these networks, where appropriate. Communication interface 910 may include one or more communication interfaces 910, where appropriate. Although this disclosure describes and illustrates a particular communication interface, this disclosure contemplates any suitable communication interface.

In particular embodiments, bus 812 includes hardware, software, or both coupling components of computer system 800 to each other. As an example and not by way of limitation, bus 812 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination of two or more of these. Bus 812 may include one or more buses 812, where appropriate. Although this disclosure describes and illustrates a particular bus, this disclosure contemplates any suitable bus or interconnect.

Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A method comprising:
    receiving, by an electrode of a device, a signal from a body of a user, the signal based on an electromagnetic interference signal generated by an object that is external to the device;
    determining, by a computing device, one or more of the following based on machine learning applied to the received signal:
    an identity of the object;
    an interaction between the user and the object; or
    a context surrounding the device; and
    optimizing, based on the received signal, a classification model identifying a plurality of fingerprints, wherein optimizing the classification model comprises:
    identifying a fingerprint corresponding to the received signal;
    presenting to the user an identification of the fingerprint corresponding to the received signal;
    receiving, from the user, input identifying whether the fingerprint corresponds to the received signal; and
    updating the classification model based on the input.

2. The method of claim 1, wherein identifying the object comprises:
    accessing information in a data store associating the object with an electromagnetic interference signal or an aspect of an electromagnetic interference signal;
    comparing the received signal with the information;
    determining, based on the comparison, a similarity between the received signal and the data store; and
    in response to the determined similarity, identifying the object associated with the information.

3. The method of claim 2, further comprising using one or more machine learning algorithms and the received signal to update the information in the data store.

4. The method of claim 1, wherein the electrode is part of a wearable device.

5. The method of claim 1, further comprising identifying, based on the signal, a contact between the user and the object.

6. The method of claim 1, wherein the object comprises an electronic device.

7. The method of claim 6, wherein identifying, based on the signal, the device further comprises identifying an operating mode of the device.

8. The method of claim 1, further comprising providing, based on the identified object, a notification to the user.

9. The method of claim 1, wherein the machine learning applied to the received signal comprises the classification model identifying a plurality of fingerprints.

10. The method of claim 9, wherein at least one of the plurality of fingerprints identifies one or more of:

a particular device;
a particular context of a particular device; or
a particular action of a particular device.

11. The method of claim 1, further comprising determining, based on the received signal, one or more boundaries for one or more fingerprints of the classification model.

12. An apparatus comprising:
an electrode; and
one or more processors coupled to the electrode and configured to:
 determine that a signal received by the electrode from a body of a user is based on an electromagnetic interference signal generated by an object that is external to the apparatus;
 determine one or more of the following based on machine learning applied to the received signal:
  an identity of the object;
  an interaction between the user and the object; or
  a context surrounding the apparatus; and
 optimize, based on the received signal, a classification model identifying a plurality of fingerprints, wherein optimizing the classification model comprises:
  identifying a fingerprint corresponding to the received signal;
  presenting to the user an identification of the fingerprint corresponding to the received signal;
  receiving, from the user, input identifying whether the fingerprint corresponds to the received signal; and
  updating the classification model based on the input.

13. The apparatus of claim 12, wherein the apparatus further comprises a wearable device.

14. The apparatus of claim 12, wherein the machine learning applied to the received signal comprises a classification model identifying the plurality of fingerprints.

15. The apparatus of claim 14, wherein at least one of the plurality of fingerprints identifies one or more of:
a particular device;
a particular context of a particular device; or
a particular action of a particular device.

16. One or more non-transitory computer-readable storage media embodying logic that is operable when executed by one or more processors to:
 determine that a signal received by an electrode of a device from a body of a user is based on an electromagnetic interference signal generated by an object that is external to the device; and
 determine one or more of the following based on machine learning applied to the received signal:
  an identity of the object;
  an interaction between the user and the object; or
  a context surrounding the device; and
 optimize, based on the received signal, a classification model identifying a plurality of fingerprints, wherein optimizing the classification model comprises:
  identifying a fingerprint corresponding to the received signal;
  presenting to the user an identification of the fingerprint corresponding to the received signal;
  receiving, from the user, input identifying whether the fingerprint corresponds to the received signal; and
  updating the classification model based on the input.

17. The method of claim 1, wherein at least one of the plurality of fingerprints is associated with at least one of: a particular computing device, a particular location of the particular computing device, or a particular time.

18. The apparatus of claim 12, wherein at least one of the plurality of fingerprints is associated with at least one of: a particular computing device, a particular location of the particular computing device, or a particular time.

19. The media of claim 16, wherein at least one of the plurality of fingerprints is associated with at least one of: a particular computing device, a particular location of the particular computing device, or a particular time.

20. The media of claim 16, wherein at least one of the plurality of fingerprints identifies one or more of:
a particular device;
a particular context of a particular device; or
a particular action of a particular device.

* * * * *